(12) United States Patent
Cho et al.

(10) Patent No.: US 8,519,747 B2
(45) Date of Patent: Aug. 27, 2013

(54) DRIVER AND HIGH VOLTAGE DRIVE CIRCUIT INCLUDING THE SAME

(75) Inventors: Kun-hee Cho, Seoul (KR); Sung-yun Park, Busan (KR); Dong-hwan Kim, Bucheon (KR)

(73) Assignee: Fairchild Korea Semiconductor Ltd., Bucheon (KR)

( * ) Notice: Subject to any disclaimer, the term of this patent is extended or adjusted under 35 U.S.C. 154(b) by 71 days.

(21) Appl. No.: 13/247,065

(22) Filed: Sep. 28, 2011

(65) Prior Publication Data

US 2012/0075000 A1 Mar. 29, 2012

(30) Foreign Application Priority Data

Sep. 28, 2010 (KR) .................. 10-2010-0093806

(51) Int. Cl.
*H03B 1/00* (2006.01)
*H03K 3/00* (2006.01)

(52) U.S. Cl.
USPC ............ 327/108; 327/112; 327/170; 327/389

(58) Field of Classification Search
USPC ..... 327/108–112, 379, 389, 391; 326/22–27, 326/81–87
See application file for complete search history.

(56) References Cited

U.S. PATENT DOCUMENTS

| | | | |
|---|---|---|---|
| 4,697,279 A * | 9/1987 | Baratti et al. ................ 377/73 |
| 6,262,618 B1 | 7/2001 | Maggiolino | |
| 6,614,208 B2 * | 9/2003 | Narita ........................... 323/283 |
| 7,057,910 B2 * | 6/2006 | Takahashi et al. ............ 363/141 |
| 7,088,151 B1 * | 8/2006 | Dequina et al. ............... 327/108 |
| 7,400,163 B2 * | 7/2008 | Yanagigawa et al. ........... 326/26 |
| 7,622,873 B2 * | 11/2009 | Takata et al. ................. 318/362 |
| 7,724,054 B2 * | 5/2010 | Honda et al. .................. 327/172 |
| 2002/0118049 A1 * | 8/2002 | Ushida et al. ................. 327/108 |
| 2004/0129957 A1 * | 7/2004 | Takahashi et al. ............ 257/232 |
| 2005/0122152 A1 | 6/2005 | Yoshida et al. |
| 2005/0200384 A1 * | 9/2005 | Nadd .............................. 326/83 |
| 2007/0013448 A1 * | 1/2007 | Azuhata et al. ................. 331/16 |
| 2007/0229051 A1 * | 10/2007 | Hwang et al. ................. 323/282 |
| 2008/0048732 A1 * | 2/2008 | Oki ................................. 327/77 |
| 2009/0051346 A1 * | 2/2009 | Manabe et al. ............... 323/363 |
| 2010/0033237 A1 * | 2/2010 | Liang et al. .................. 327/543 |
| 2010/0259954 A1 * | 10/2010 | Santoro et al. ............. 363/21.02 |
| 2011/0316585 A1 * | 12/2011 | Lee et al. ....................... 326/52 |
| 2012/0032657 A1 * | 2/2012 | Dequina ........................ 323/271 |
| 2012/0319743 A1 * | 12/2012 | Morishita et al. ............. 327/110 |

* cited by examiner

*Primary Examiner* — Lincoln Donovan
*Assistant Examiner* — Brandon S Cole
(74) *Attorney, Agent, or Firm* — Okamoto & Benedicto LLP (57) ABSTRACT

A high voltage drive circuit includes an edge detector for generating an edge detection signal by detecting edges of a first high side input signal and a first low side input signal, the edge detector providing a high side delay signal and a low side delay signal by delaying the first high side input signal and the first low side input signal, a dead time generator for generating a dead time signal indicating a preset dead time in response to the edge detection signal, and a driver comprising a drive signal generator for providing a high side output signal and a low side output signal by inserting the preset dead time based on the dead time signal into the high side delay signal and the low side delay signal.

16 Claims, 6 Drawing Sheets

DRIVER AND HIGH VOLTAGE DRIVE CIRCUIT INCLUDING THE SAME

CROSS-REFERENCE TO RELATED APPLICATIONS

This application claims the benefit of Korean Patent Application No. 10-2010-0093806, filed on Sep. 28, 2010, in the Korean Intellectual Property Office, the disclosure of which is incorporated herein in its entirety by reference.

BACKGROUND

The present inventive concept relates to a dead lime generation circuit, and more particularly, to a dead lime generation circuit which may reduce mismatching of dead time by sharing a path for generating dead time, and a high voltage drive integrated circuit (IC) including the dead lime generation circuit.

A high voltage drive IC for driving a high voltage may include a high side gate driver and a low side gate driver. The high side gate driver and the low side gate driver are connected to drive voltages different from each other and supply drive voltages different from each other according to a turn-on/off state of each of the high side gate driver and the low side gate driver.

SUMMARY

The inventive concept provides a driver which may reduce mismatching of dead time included in high side and low side gate drive signals by sharing a signal path for generating the dead time.

The inventive concept provides a high voltage drive circuit having a driver which may stably provide an output signal by detecting an edge of an input signal, generate dead time based on an edge detection signal having a relatively small error so that an error of the dead time, and minimizing an error of the dead time.

According to an aspect of the inventive concept, there is provided a high voltage drive circuit including an edge detector for generating an edge detection signal by detecting edges of a first high side input signal and a first low side input signal, the edge detector providing a high side delay signal and a low side delay signal by delaying the first high side input signal and the first low side input signal, a dead time generator for generating a dead time signal indicating a preset dead time in response to the edge detection signal, and a driver comprising a drive signal generator for providing a high side output signal and a low side output signal by inserting the preset dead time based on the dead time signal into the high side delay signal and the low side delay signal.

The dead time generator may include a delay capacitor charged in response to the edge detection signal, and a comparator for providing the dead time signal by comparing a delay voltage corresponding to an amount of electric charges changed in the delay capacitor with a reference voltage. The dead time generator may further include an external resistor electrically connected to the delay capacitor via a pad and controlling the preset dead time.

The drive signal generator may include a first logic operator for providing the high side output signal by performing an AND operation on the high side delay input signal and the dead time signal, and a second logic operator for providing the low side output signal by performing an AND operation on the low side delay input signal and the dead time signal.

The high voltage drive circuit may further include a shoot-through preventer for receiving a second high side input signal and a second low side input signal and, when the second high side input signal and the second low side input signal are simultaneously activated, deactivating the second high side input signal and the second low side input signal and providing the deactivated second high side and low side input signals as the first high side input signal and the first low side input signal, respectively.

The shoot-through preventer may include an RS latch circuit for providing a high side latch signal and a low side latch signal by receiving the second high side input signal as a set signal and the second low side input signal as a reset signal, a first prevention logic operator for providing the first high side input signal by performing an AND operation on the high side latch signal and the second high side input signal, and a second prevention logic operator for providing the first low side input signal by performing an AND operation on a low side latch signal, and the second low side input signal.

The low side latch signal may correspond to a complementary signal of the high side latch signal.

The edge detector may generate the edge detection signal activated for a preset edge detection time by detecting at least one of rising edges of the first high side input signal and the first low side input signal. The edge detector may include an input delay unit for generating the high side delay signal based on the first high side input signal and a high side intermediate input signal obtained by delaying the first high side input signal, and generating the low side delay signal based on the first low side input signal and a low side intermediate input signal obtained by delaying the first low side input signal, and an edge detection logic operator for generating the edge detection signal based on the high side delay signal and the low side delay signal.

The input delay unit may include at least one high side delay buffer for providing the high side intermediate input signal by delaying the first high side input signal, at least one low side delay buffer for providing the low side intermediate input signal by delaying the first low side input signal, and an input delay logic operation unit for providing the high side delay signal by performing an AND operation on the high side intermediate input signal and the first high side input signal, and providing the low side delay signal by performing an AND operation on the low side intermediate input signal and the first low side input signal.

According to another aspect of the inventive concept, there is provided a high voltage drive circuit including a driver for generating an edge detection signal by detecting rising edges of a first high side input signal and a first low side input signal, generating a dead time signal indicating a preset dead time in response to the edge detection signal, and providing a high side output signal and a low side output signal by inserting the preset dead time based on the dead time signal into the first high side and low side input signals, and an output terminal driven by a high power voltage and providing a system output signal in response to the high side output signal and a low side output signal.

The output terminal may include a high side output transistor connected between the high power voltage and an output end through which the system output signal is provided, and turned on in response to the high side output signal, and a low side output transistor connected between the output end and a ground terminal and turned on in response to the low side output signal.

The edge detection signal may be activated for a preset edge detection time and the preset edge detection time may be shorter than the preset dead time.

The driver may include an edge detector for generating the edge detection signal by detecting edges of the first high side input signal and the first low side input signal, the edge detector providing a high side delay signal and a low side delay signal by delaying the first high side input signal and the first low side input signal, a dead time generator for generating the dead time signal in response to the edge detection signal, and a drive signal generator for providing the high side output signal and the low side output signal by inserting the preset dead time based on the dead time signal into the high side delay signal and the low side delay signal.

The high voltage drive circuit may further include a shoot-through preventer for receiving a second high side input signal and a second low side input signal from the outside and, when the second high side input signal and the second low side input signal are simultaneously activated, deactivating the second high side input signal and the second low side input signal and providing the deactivated second high side and low side input signals as the first high side input signal and the first low side input signal, respectively.

The high power voltage may be about 600 V.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

The system and method according to an exemplary embodiment of the present inventive concept is described in detail with reference to the accompanying drawings. However, the present inventive concept is not limited thereto and it will be understood that various changes in form and details may be made therein without departing from the spirit and scope of the following claims. That is, descriptions on particular structures or functions may be presented merely for explaining exemplary embodiments of the present inventive concept.

The terms such as "first" and "second" are used herein merely to describe a variety of constituent elements, but the constituent elements are not limited by the terms. The terms are used only for the purpose of distinguishing one constituent element from another constituent element. For example, without departing from the right scope of the present inventive concept, a first constituent element may be referred to as a second constituent element, and vice versa.

In the present specification, when a constituent element "connects" or is "connected" to another constituent element, the constituent element contacts or is connected to the other constituent element directly or through at least one of other constituent elements. Conversely, when a constituent element is described to "directly connect" or to be "directly connected" to another constituent element, the constituent element should be construed to be directly connected to another constituent element without any other constituent element interposed therebetween. Other expressions, such as, "between" and "directly between", describing the relationship between the constituent elements, may be construed in the same manner.

The terms used in the present specification are used for explaining a specific exemplary embodiment, not limiting the present inventive concept. Thus, the expression of singularity in the present specification includes the expression of plurality unless clearly specified otherwise in context. Also, the terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

Unless defined otherwise, all terms used herein including technical or scientific terms have the same meanings as those generally understood by those skilled in the art to which the present inventive concept may pertain. The terms as those defined in generally used dictionaries are construed to have meanings matching that in the context of related technology and, unless clearly defined otherwise, are not construed to be ideally or excessively formal.

Hereinafter, the present invention will be described in detail by explaining preferred embodiments of the invention with reference to the attached drawings. Like reference numerals in the drawings denote like elements.

Figure 1:
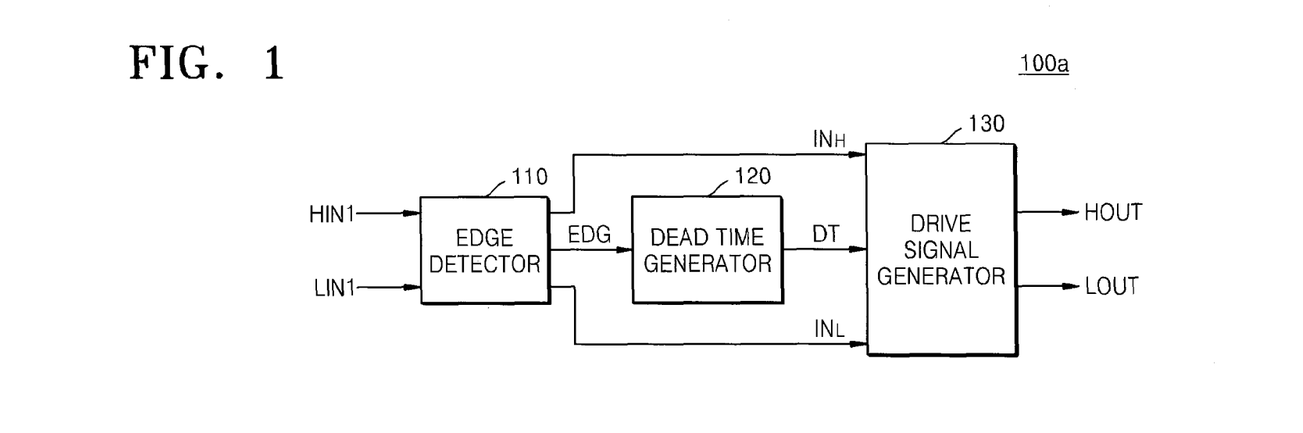
FIGS. 1 and 2 are block diagrams illustrating drivers according to exemplary embodiments of the present inventive concept.

FIG. 1 is a block diagram illustrating a driver 100a according to an exemplary embodiment of the present inventive concept. Referring to FIG. 1, the driver 100a may include an edge detector 110, a dead time generator 120, and a drive signal generator 130.

The edge detector 110 may receive a first high side input signal HIN1 and a first low side input signal LIN1 and generate an edge detection signal EDG by detecting an edge of each signal. For example, the edge detector 110 detects at least one rising edge or falling edge of the first high side input signal HIN1 and the first low side input signal LIN1 and generates the edge detection signal EDG. Alternatively, the edge detection signal EDG may vary according to the frequencies and duty ratios of the first high side input signal HIN1 and the first low side input signal LIN1.

The edge detector 110 may delay the first high side input signal HIN1 and the first low side input signal LIN1 and provide a high side delay signal $IN_H$ and a low side delay signal $IN_L$. The high side delay signal $N_H$ and the low side delay signal $IN_L$ each may be signals obtained by delaying the first high side input signal HIN1 and the first low side input signal LIN1 for a preset delay time. Alternatively, the time to make the high side delay signal $IN_H$ by delaying the first high side input signal HIN1 and the time to make the low side delay signal $IN_L$ by delaying the first low side input signal LIN1 may be different from each other.

The dead time generator 120 may generate a dead time signal DT indicating a preset dead time in response to the edge detection signal EDG. The dead time signal DT may indicate a preset dead time during which a logic state of the dead time signal DT is maintained unchanged. For example, the dead time signal DT may maintain a logic state "HIGH" for a preset dead time and then shift to a logic state "LOW" after the preset dead time passes. However, the above description is a mere example and the dead time signal DT may indicate a dead time preset in a different method.

The drive signal generator 130 may receive the high side delay signal $IN_H$ and the low side delay signal $IN_L$ and provide a high side output signal ROUT and a low side output signal LOUT by inserting a preset dead time into each of the first high side input signal HIN1 and the first low side input signal LIN1 based on the dead time signal DT.

Figure 9:
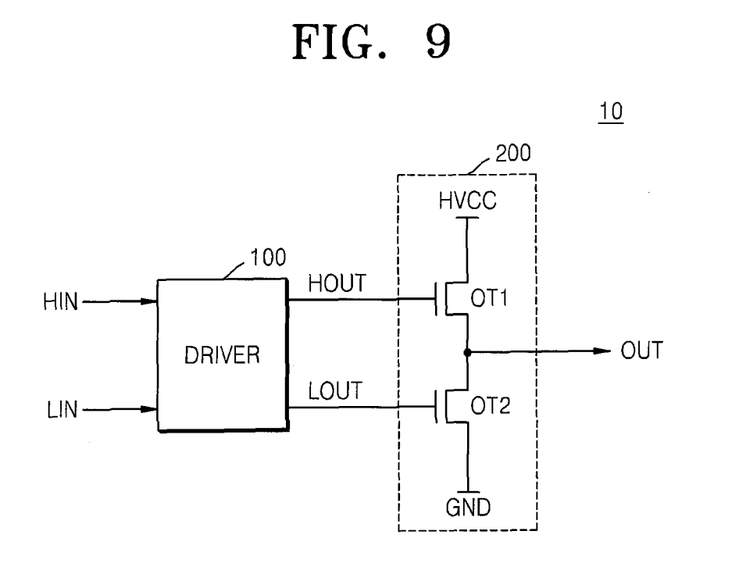
FIG. 9 illustrates a high voltage drive circuit including a driver according to an exemplary embodiment of the present inventive concept.

The high side output signal HOUT may be generated based on the high side delay signal $IN_H$ and the dead time signal DT, whereas the low side output signal LOUT may be generated based on the low side delay signal $IN_L$ and the dead time signal DT. When the high side output signal HOUT and the low side output signal LOUT are simultaneously activated, a high side output terminal and a low side output terminal including in a drive output terminal that is driven by a high voltage of about 600 V are simultaneously turned on so that a shoot-through phenomenon that a large amount of current momentarily flows in the output terminal may occur. Thus, to prevent the shoot-through phenomenon, a preset dead time may be inserted at shift time of the first high side input signal HIN1 and the first low side input signal LIN1.

When preset dead times are inserted into each of the first high side input signal HIN1 and the first low side input signal LIN1, the preset dead times may be different from each other. When different dead times are respectively inserted into the first high side input signal HIN1 and the first low side input signal LIN1, since balance between high side and low side output terminals that complementarily operate may be broken, a system output signal (OUT of FIG. 9) that is finally provided may not be stably provided.

The mismatching of the dead time inserted into the first high side input signal HIN1 and the first low side input signal LIN1 may be resulted from the insertion of the dead time through different paths. Thus, the driver 100*a* according to the exemplary embodiments of the present inventive concept may minimize the mismatching of dead time by inserting a dead time preset based on a single dead time signal DT into the first high side input signal HIN1 and the first low side input signal LIN1.

Figure 2:
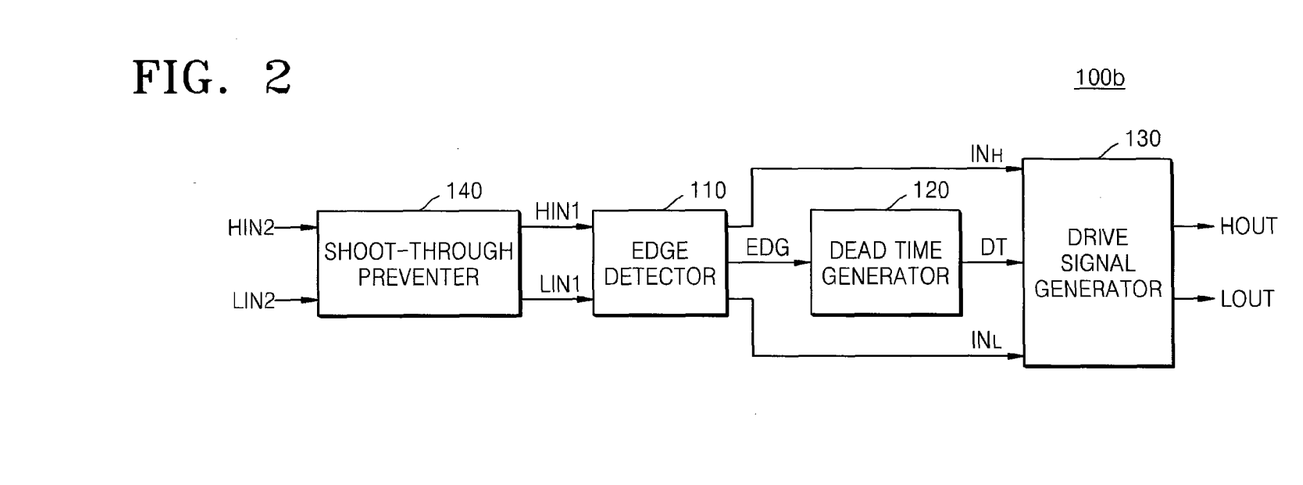

FIG. 2 is a block diagram illustrating a driver 100*b* according to another exemplary embodiment of the present inventive concept. Referring to FIG. 2, the driver 100*b* may include a shoot-through preventer 140, the edge detector 110, the dead time generator 120, and the drive signal generator 130. Compared with the driver 100*a* of FIG. 1, the driver 100*b* of FIG. 2 further includes the shoot-through preventer 140.

The shoot-through preventer 140 receives a second high side input signal HIN2 and a second low side input signal LIN2 and provides the first high side input signal HIN1 and the first low side input signal LIN1. In general, the first high side input signal HIN1 and the first low side input signal LIN1 may be substantially the same as the second high side input signal HIN2 and the second low side input signal LIN2, respectively. However, when the second high side input signal HIN2 and the second low side input signal LIN2 are simultaneously activated, the shoot-through preventer 140 deactivates the second high side input signal HIN2 and the second low side input signal LIN2 and provides the deactivated second high side and low side input signals HIN2 and LIN2 as the first high side input signal HIN1 and the first low side input signal LIN1.

When the first high side input signal HIN1 and the first low side input signal LIN1 are simultaneously activated, a shoot-through phenomenon may occurs. Thus, when the second high side input signal HIN2 and the second low side input signal LIN2 are simultaneously activated, the shoot-through preventer 140 deactivates the second high side input signal HIN2 and the second low side input signal LIN2 and provides the deactivated second high side and low side input signals HIN2 and LIN2 as the first high side input signal HIN1 and the first low side input signal LIN1.

The structure of the driver 100*b* except for the shoot-through preventer 140 is substantially the same as that of the driver 100*a* of FIG. 1. Like reference numerals in the drawings denote like elements. Accordingly, detailed descriptions on the like elements may be omitted herein.

Figure 3:
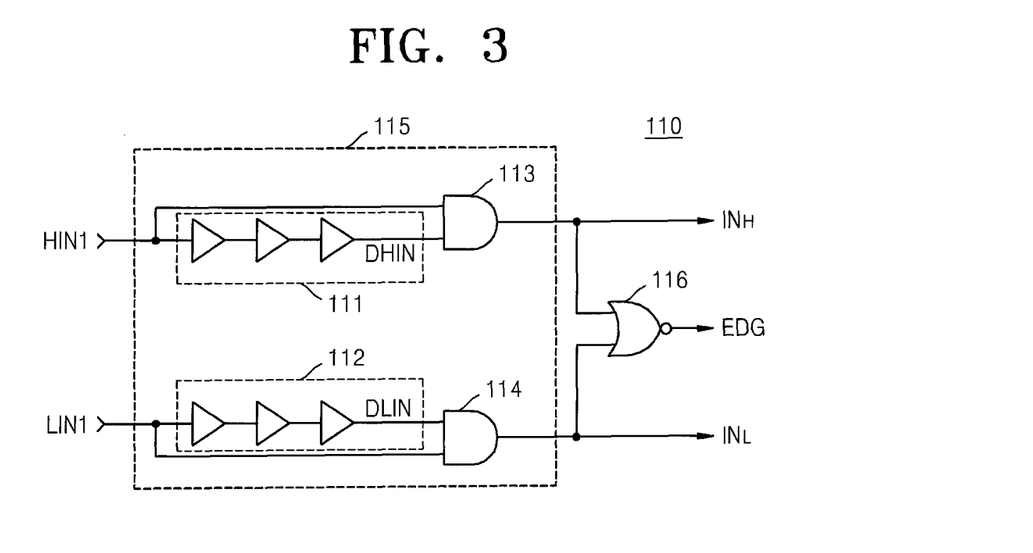
FIG. 3 illustrates an edge detector of FIGS. 1 and 2 according to an exemplary embodiment of the present inventive concept.

FIG. 3 illustrates the edge detector 110 of FIGS. 1 and 2 according to an exemplary embodiment of the present inventive concept. Referring to FIG. 3, the edge detector 110 may include an input delay unit 115 and an edge detection logic operator 116.

The input delay unit 115 may generate a high side intermediate input signal DHIN and a low side intermediate input signal DLIN by delaying the first high side input signal HIN1 and the first low side input signal LIN1. The input delay unit 115 may provide the high side delay signal $IN_H$ based on the high side intermediate input signal DHIN and the first high side input signal HIN1, and provide the low side delay signal $IN_L$ based on the low side intermediate input signal DLIN and the first low side input signal LIN1.

The input delay unit 115 may include at least one high side delay buffer 111 for providing the high side intermediate input signal DHIN by delaying the first high side input signal HIN1, at least one low side delay buffer 112 for providing the low side intermediate input signal DLIN by delaying the first low side input signal LIN1, and an input delay logic operation unit for providing the high side delay signal $IN_H$ by performing a logic operation on the high side intermediate input signal DHIN and the first high side input signal HIN1, and providing the low side delay signal $IN_L$ by performing a logic operation on the low side intermediate input signal DLIN and the first low side input signal LIN1.

The input delay logic operation unit may include a first input delay logic operator 113 and a second input delay logic operator 114. The first input delay logic operator 113 may provide the high side delay signal $IN_H$ by performing an AND operation on the high side intermediate input signal DHIN and the first high side input signal HIN1. The second input delay logic operator 114 may provide the low side delay signal $IN_L$ by performing an AND operation on the low side intermediate input signal DLIN and the first low side input signal LIN1.

The edge detection logic operator 116 may generate the edge detection signal EDG based on the high side delay signal $IN_H$ and the low side delay signal $IN_L$. The edge detection logic operator 116 may be an NOR logic operator. The edge detection signal EDG may be activated for a preset edge detection time at at least one rising edge or falling edge of the first high side input signal HIN1 and the first low side input signal LIN1. The edge detection signal EDG may have diverse characteristics according to a structure of the edge detector 110. The above description on the edge detection signal EDG is a mere example thereof.

Figure 4:
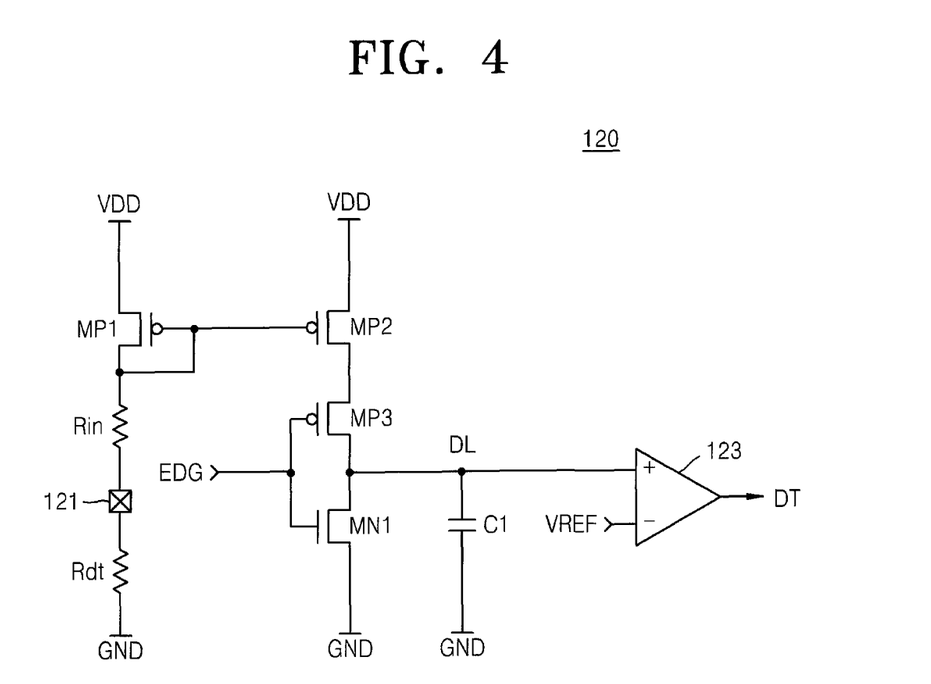
FIG. 4 is a circuit diagram illustrating a dead time generator of FIGS. 1 and 2 according to an exemplary embodiment of the present inventive concept.

FIG. 4 is a circuit diagram illustrating the dead time generator 120 of FIGS. 1 and 2 according to an exemplary embodiment of the present inventive concept. Referring to FIG. 4, the dead time generator 120 may include first through third PMOS transistors MP1, MP2, and MP3, a first NMOS transistor MN1, an internal resistor Rin, a delay capacitor C1, and a comparator 123.

The first PMOS transistor MP1 includes a first terminal to which a power voltage VDD is applied, a second terminal connected to an inner resistor Rin, and a gate connected to the second terminal. The inner resistor Rin may be connected to an external resistor Rdt via a pad 121. The external resistor Rdt may be connected between the pad 121 and a ground voltage GND.

The second PMOS transistor MP2 may include a first terminal to which the power voltage VDD is applied and a gate connected to a gate of the first PMOS transistor MP1. The first PMOS transistor MP1 and the second PMOS transistor MP2 form a current mirror so that current flowing in the second terminal of the first PMOS transistor MP1 and current flowing in a second terminal of the second PMOS transistor MP2 may be substantially the same. Thus, since the current flowing the second terminal of the first PMOS transistor MP1 may vary according to the amount of the external resistor Rdt, the current flowing in the second terminal of the second PMOS transistor MP2 may be determined by controlling the external resistor Rdt.

The third PMOS transistor MP3 may include a first terminal connected to the second terminal of the second PMOS transistor MP2 and a gate to which the edge detection signal EDG is applied. The first NMOS transistor MN1 includes a first terminal connected to a second terminal of the third PMOS transistor MP3, a second terminal connected to the ground voltage GND, and a gate to which the edge detection signal EDG is applied.

The delay capacitor C1 is electrically connected to the second terminal of the third PMOS transistor MP3, that is, between the first terminal of the first NMOS transistor MN1 and the ground voltage GND. The delay capacity C1 may charge or discharge electric charges according to the third PMOS transistor MP3 and the first NMOS transistor MN1 complementarily operating in response to the edge detection signal EDG.

The comparator 123 generates the dead time signal DT by comparing a delay voltage DL corresponding to the amount of electric charges of the delay capacitor C1 with a reference voltage VREF. The dead time signal DT may correspond to a signal indicating a preset dead time. For example, when the delay voltage DL is greater than the reference voltage VREF, the dead time signal DT may be activated. The reference voltage VREF may be provided by an external apparatus such as a voltage generator and a preset dead time may vary according to the amount of the reference voltage VREF.

Figure 5:
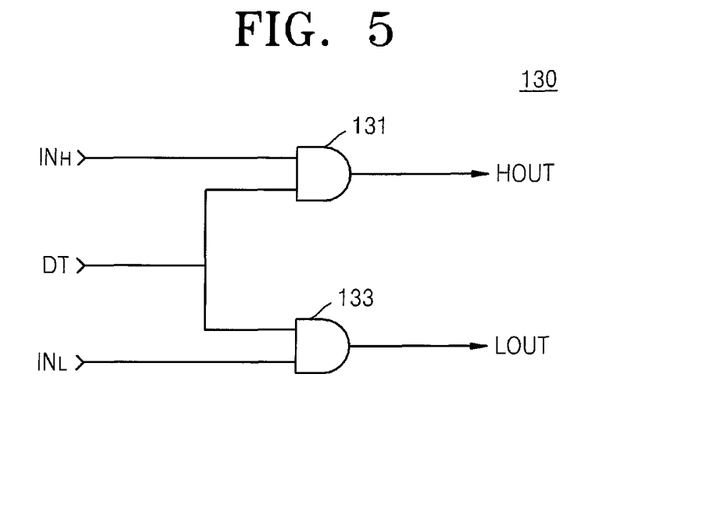
FIG. 5 is a circuit diagram illustrating a drive signal generator of FIGS. 1 and 2 according to an exemplary embodiment of the present inventive concept.

FIG. 5 is a circuit diagram illustrating the drive signal generator 130 of FIGS. 1 and 2 according to an exemplary embodiment of the present inventive concept. Referring to FIGS. 1 and 2, the drive signal generator 130 may include a first logic operator 131 and a second logic operator 133.

The first logic operator 131 provides the high side output signal HOUT by performing an AND operation on the high side delay signal $IN_H$ and the dead time signal DT. The second logic operator 133 provides the low side output signal LOUT by performing an AND operation on the low side delay signal $IN_L$ and the dead time signal DT.

The high side output signal HOUT may correspond to a signal obtained by inserting the preset dead time shown as the dead time signal DT into the high side delay signal $IN_H$. For example, the preset dead time may be inserted such that a logic state can be shifted at a time point delayed by the preset dead time from a rising edge where the high side output signal HOUT is shifted from a logic state "LOW" to a logic state "HIGH". Also, the preset dead time may be inserted such that a logic state can be shifted at a time point delayed by the preset dead time from a falling edge where the high side output signal HOUT is shifted from a logic state "HIGH" to a logic state "LOW".

Similarly to the high side output signal HOUT, the low side output signal LOUT may correspond to a signal obtained by inserting the preset dead time shown as the dead time signal DT into the low side delay signal $IN_L$. The low side output signal LOUT may be shifted at a time point delayed by the preset dead time from a shift time.

Figure 6:
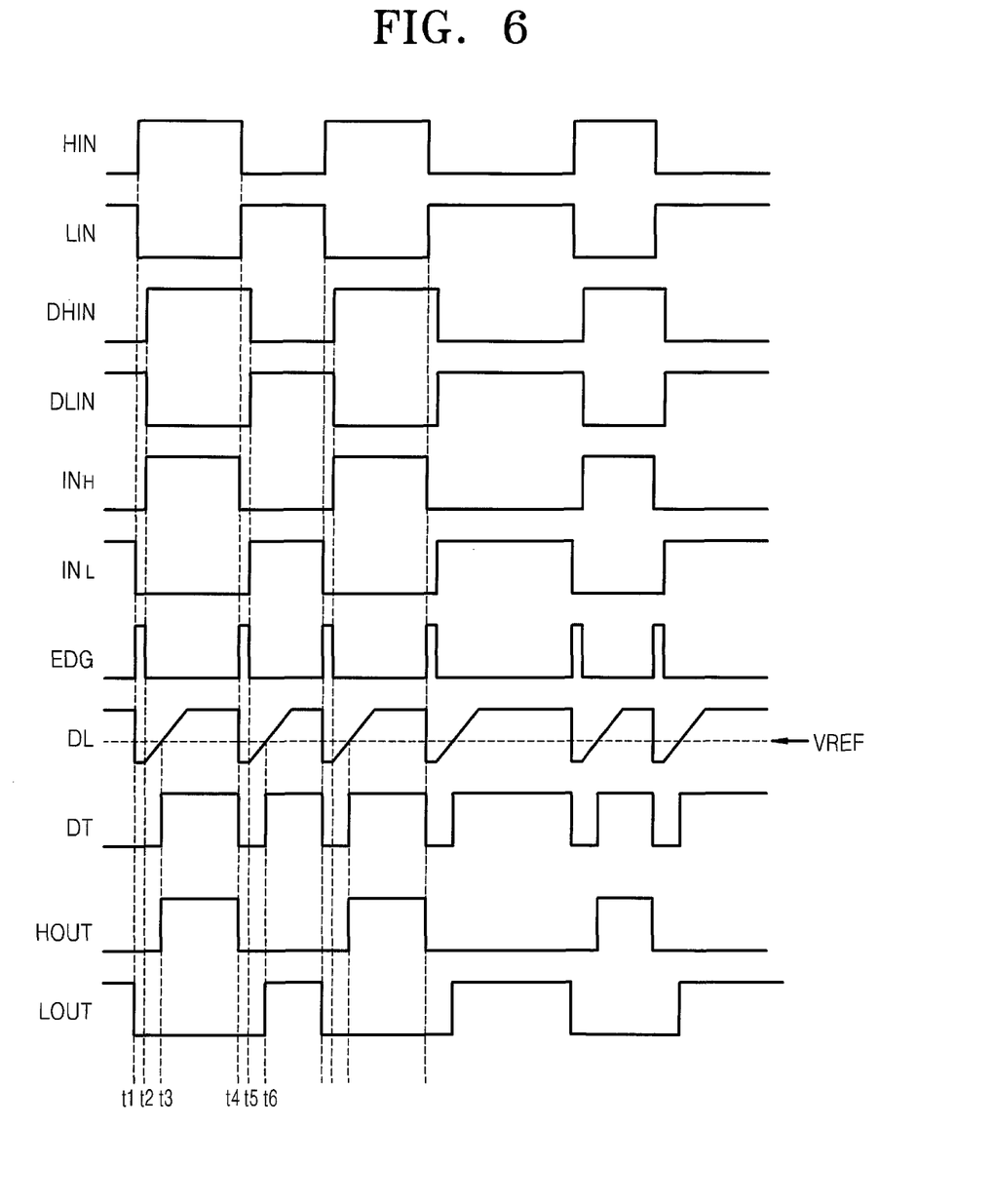
FIG. 6 is a waveform diagram for explaining operations of the drivers according to the exemplary embodiments of the present inventive concept.

FIG. 6 is a waveform diagram for explaining operations of the drivers according to the exemplary embodiments of the present inventive concept. In the operation of the drivers according to the above-described exemplary embodiments with reference to FIGS. 1-6, HIN may correspond to the first high side input signal HIN1 and the second high side input signal HIN2 of FIGS. 1 and 2. When the first high side input signal HIN1 is not activated at the same time with the first low side input signal LIN1, the second high side input signal HIN2 that is substantially the same as the first high side input signal HIN1 is indicated as HIN and described as a high side input signal. LIN may correspond to the first low side input signal LIN1 and the second low side input signal LIN2 of FIGS. 1 and 2. Similarly to HIN, LIN may include both of the first low side input signal and the second low side input signal LIN2.

DHIN denotes a high side intermediate input signal, DLIN denotes a low side intermediate input signal, $IN_H$ denotes a high side delay signal, $IN_L$ denotes a low side delay signal, EDG denotes an edge detection signal, DL denotes a delay voltage corresponding to the amount of electric charges charged in the delay capacitor C1 of FIG. 4, DT denotes a dead time signal, HOUT denotes a high side output signal, and LOUT denotes a low side output signal.

At a time point t1, the high side input signal HIN is activated and the low side input signal LIN is deactivated. In the present description, when a particular signal is activated, the signal is in a logic state "HIGH". When the signal is deactivated, the signal is in a logic state "LOW". However, the logical states may be reversed.

In response to the deactivated low side input signal LIN, the low side delay signal $IN_L$ is deactivated and the low side output signal LOUT is deactivated. In response to the activated high side input signal HIN, the edge detection signal EDG is activated. In response to the edge detection signal EDG, the delay voltage DL is discharged to a ground voltage GND level.

The high side input signal HIN may be provided as the high side intermediate input signal HIN after passing through at least one of the high side buffers 111 of FIG. 3. The low side input signal LIN may be provided as the low side intermediate input signal LIN after passing through at least one of the low side buffers 112 of FIG. 3. The high side intermediate input signal HIN and the low side intermediate input signal LIN may be shifted at a time point t2 that is delayed by a preset delay time. The high side delay signal $IN_H$ is provided by performing an AND operation on the high side input signal HIN and the high side intermediate input signal DHIN. The low side delay signal $IN_L$ is provided by performing an AND operation on the low side input signal LIN and the low side intermediate input signal DLIN. Thus, the high side delay signal $IN_H$ and the low side delay signal $IN_L$ have a delayed form only at a rising edge where the logic state is shifted from "LOW" to "HIGH".

The edge detection signal EDG may be provided by performing an AND operation on the high side delay signal $IN_H$ and the low side delay signal $IN_L$. Thus, the high side delay signal $IN_H$ is shifted according to the high side intermediate input signal DHIN and the edge detection signal EDG is deactivated.

The edge detection signal EDG may maintain an activated state as long as the high side input signal HIN passes through at least one of the high side delay buffers 111 and thus the high side intermediate input signal DHIN is activated. Alternatively, the edge detection signal EDG may be activated for a preset edge detection time. When the edge detection signal EDG is deactivated, the delay voltage DL that has been initialized to the ground voltage GND level starts to be charged and linearly increases.

The dead time signal DT is activated at a time point t3 when the delay voltage DL that linearly increases is greater than the reference voltage VREF. Thus, the dead time signal DT may be deactivated for the preset dead time in response to the edge detection signal EDG. As a result, the time during which the delay capacitor C1 is charged to the reference voltage VREF in response to the edge detection signal EDG may correspond to the preset dead time.

The preset edge detection time may correspond to a time obtained by subtracting the time point t1 from the time point t2 and be relatively shorter than a time obtained by subtracting the time point t1 from the time point t3 that is the preset dead time. For example, the preset edge detection time may be much shorter than the preset dead time. The driver according to an exemplary embodiment of the present invention may determine the preset dead time based on the preset edge detection time that is relatively short. Thus, an error of the preset dead time may be reduced, and mismatching of a dead time inserted into the high side and low side output signals HOUT and LOUT may be minimized by inserting a dead time preset based on the same dead time signal DT into the high side output signal HOUT and the low side output signal LOUT.

The high side output signal HOUT may be provided by performing an AND operation on the high side delay signal $IN_H$ and the dead time signal DT. Although the high side output signal HOUT may be provided by performing an AND operation on the high side input signal HIN and the dead time signal DT, in this case, the high side input signal HIN may be provided by being delayed so that noise such as a peak may be included in the high side output signal HOUT. Thus, a dead time may be stably inserted by providing the high side output signal HOUT by performing an AND operation on the high side delay signal $IN_H$ that is obtained by delaying the high side input signal HIN, and the dead time signal DT.

In a similar method employed for the high side output signal HOUT, the low side output signal LOUT may be provided by performing an AND operation on the low side delay signal $IN_L$ and the dead time signal DT. The stability of the low side output signal LOUT may be obtained by performing an AND operation on the low side delay signal $IN_L$ that delays the rising edge of the low side output signal LOUT.

The low side input signal LIN is shifted from a logic state "LOW" to a logic state "HIGH" at a time point t4. The edge detection signal EDG is activated in response to the low side input signal LIN and the delay voltage DL is dropped to the ground voltage GND level. As the delay voltage DL is initialized, the dead time signal DT is deactivated.

The low side input signal LIN is delayed at a time point t5 and thus the low side intermediate input signal DLIN is activated. As the low side intermediate input signal DLIN and the low side input signal LIN are AND-operated, the low side delay signal $IN_L$ is activated. The edge detection signal EDG is deactivated and the delay voltage DL linearly increases. Accordingly, the edge detection signal EDG may maintain an activated state while the low side input signal LIN is delayed by at least one of the low side delay buffers 112 and thus the low side intermediate input signal DLIN becomes activated. Alternatively, the activation time of the edge detection signal EDG generated in response to the activation of the high side input signal HIN may correspond to a time (t2-t1), whereas the activation time of the edge detection signal EDG generated in response to the activation of the low side input signal LIN may correspond to a time (t5-t4). Also, the activation time of the edge detection signal EDG may vary according to at least one of the high side buffers 111 and at least one of the low side buffers 112, and various parasitic factors affecting the transmission of a signal. However, compared with the preset dead time generated by the dead time signal DT, the activation time of the edge detection signal EDG is relatively short so that the influence of mismatching may be reduced.

The delay voltage DL that linearly increases becomes greater than the reference voltage VREF at a time point t6 so that the dead time signal DT may be activated. The low side output signal LOUT is activated in response to the activated dead time signal DT. Thus, with respect to the low side input signal LIN activated at the time point t4, the low side output signal LOUT is activated at the time point t6 when the dead time is inserted.

Since the dead time is inserted from the time point t4 when the high side output signal HOUT is deactivated to the time point t6 when the low side output signal LOUT is activated, a shoot-through phenomenon that may be generated as the high side output signal HOUT and the low side output signal LOUT are simultaneously activated may be prevented. Therefore, in the high voltage drive circuit including a driver according to the present inventive concept, since the single delay capacitor C1 is charged in response to the edge detection signal EDG and thus the dead time signal DT is generated, the mismatching of the dead time inserted into the high side and low side output signals HOUT and LOUT may be minimized.

Figure 7:
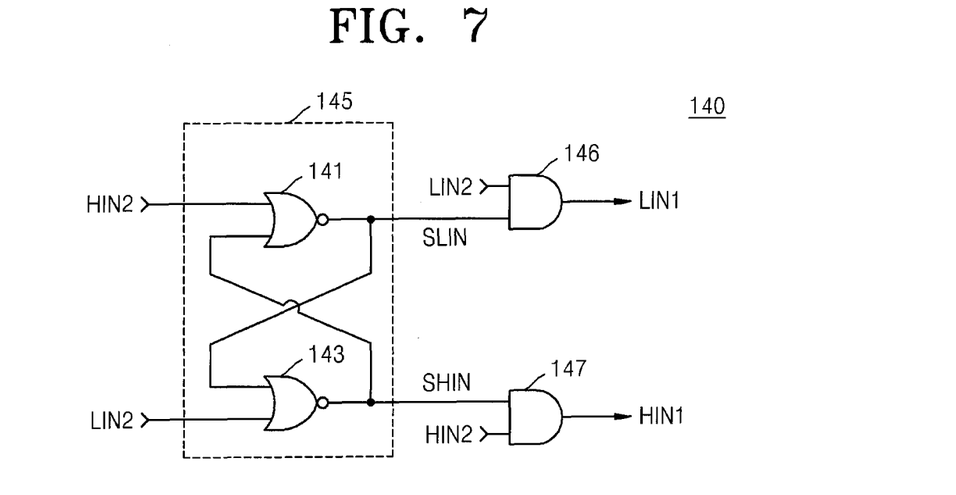
FIG. 7 illustrates a shoot-through preventer of FIG. 2 according to an exemplary embodiment of the present inventive concept.

FIG. 7 illustrates the shoot-through preventer 140 of FIG. 2 according to an exemplary embodiment of the present inventive concept. Referring to FIG. 7, the shoot-through preventer 140 may include an RS latch circuit 145, a first prevention logic operator 146, and a second prevention logic operator 147.

The RS latch circuit 145 may include a first AND operator 141 and a second AND operator 143. The RS latch circuit 145 receives the second high side input signal HIN2 as a set signal and the second low side input signal LIN2 as a reset signal and provides a high side latch signal SHIN. The high side latch signal SHIN is activated in response to the second high side input signal HIN2 and deactivated in response to the second low side input signal LIN2. Also, when both of the second high side input signal HIN2 and the second low side input signal LIN2 are deactivated, the high side latch signal SHIN maintains the preceding state. When both of the second high side input signal HIN2 and the second low side input signal LIN2 are activated, the high side latch signal SHIN and a low side latch signal SLIN are deactivated.

The first prevention logic operator 146 performs an AND operation on the second low side input signal LIN2 and the low side latch signal SLIN and provides the first low side input signal LIN1. The second prevention logic operator 147 performs an AND operation on the second high side input signal HIN2 and the high side latch signal SHIN and provides the first high side input signal HIN1.

Except that the second high side input signal HIN2 and the second low side input signal LIN2 are simultaneously activated, the first high side input signal HIN1 and the first low side input signal LIN1 are substantially the same as the second high side input signal HIN2 and the second low side input signal LIN2, respectively.

The shoot-through preventer 140 prevents the first high side input signal HIN1 and the first low side input signal LIN1 from being simultaneously activated so that generation of a shoot-through phenomenon before inserting a dead time may be prevented. Thus, the driver 100b including the shoot-through preventer 140 may operate with more reliability.

Figure 8:
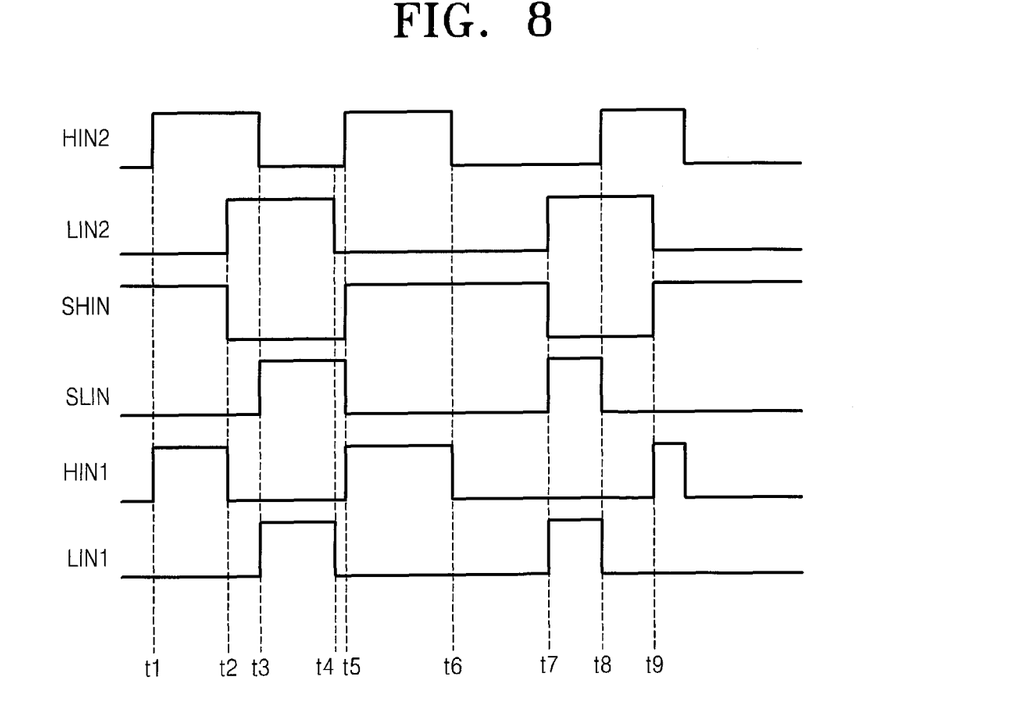
FIG. 8 is a waveform diagram for explaining an operation of a shoot-through preventer according to an exemplary embodiment of the present inventive concept.

FIG. 8 is a waveform diagram for explaining an operation of the shoot-through preventer 140 according to an exemplary embodiment of the present inventive concept. In FIG. 8, HIN2 denotes a second high side input signal, LIN2 denotes a second low side input signal, SHIN denotes a high side latch signal, SLIN denotes a low side latch signal, HIN1 denotes a first high side input signal, and LIN1 denotes a first low side input signal.

Referring to FIGS. 7 and 8, the operation of the shoot-through preventer 140 according to the above-described exemplary embodiment will be described. At a time point t1, the second high side input signal HIN2 is activated. Since the second low side input signal LIN2 maintains an inactive state, the high side latch signal SHIN in the preceding state maintains an active state and the low side latch signal SLIN corresponding to a complementary signal of the high side latch signal maintains an inactive state. The first high side latch signal HIN1 provided by performing an AND operation on the second high side input signal HIN2 and the high side latch signal SHIN is shifted to a logic state "HIGH" so as to have substantially the same waveform as the second high side input signal HIN2. The first low side input signal LIN1 maintains the inactive state.

The second low side input signal LIN2 is activated at a time point t2 when the second high side input signal HIN2 is activated. In response to the activation of the second low side input signal LIN2, the high side latch signal SHIN and the first high side input signal HIN1 are deactivated. Thus, when the second high side input signal HIN2 and the second low side input signal LIN2 are simultaneously activated, both of the first high side input signal HIN1 and the first low side input signal LIN1 are deactivated.

When the second high side input signal HIN2 is deactivated at a time point t3, the low side latch signal SLIN is activated. The first low side input signal LIN1 is activated in response to the activated low side latch signal SLIN. Accordingly, when only the second low side input signal LIN2 is activated as the second high side input signal HIN2 is deactivated, the first low side latch signal LIN1 is activated and thus the second low side latch signal LIN2 and the first low side latch signal LIN1 are substantially the same.

Even when the second low side input signal LIN2 is deactivated at a time point t4, the high side and low side latch signals SHIN and SLIN maintain the preceding state and the first low side latch signal LIN1 is deactivated by the second low side input signal LIN2.

When the second high side input signal HIN2 is activated at a time point t5, the high side latch signal SHIN is activated and the low side latch signal SLIN is deactivated. The first high side input signal HIN1 is activated by performing an AND operation on the second high side input signal HIN2 and the high side latch signal SHIN.

Even when the second high side input signal HIN2 is deactivated at a time point t6, the high side and low side latch signals SHIN and SLIN maintain the preceding state and the first high side latch signal HIN1 is deactivated.

When the second low side input signal LIN2 is activated at a time point t7, the low side latch signal SLIN is activated and the high side latch signal SHIN is deactivated. The first low side input signal LIN1 is activated by performing an AND operation on the second low side input signal LIN2 and the low side latch signal SHIN.

At a time point t8 when the second low side input signal LIN2 is activated, the second high side input signal HIN2 is activated as well. As the low side latch signal SLIN is deactivated in response to the activated second high side input signal HIN2, the first low side input signal LIN1 is deactivated. Since the high side latch signal SHIN maintains an inactive state, the first high side input signal HIN1 maintains an inactive state.

At a time pint t9, as the second low side input signal LIN2 is deactivated, the second high side input signal HIN2 is activated. The high side latch signal SHIN is activated and thus the first high side input signal HIN1 is activated in response thereto.

As a result, the shoot-through preventer 140 deactivates the second high side input signal HIN2 and the second low side input signal LIN2 that are simultaneously activated. In the other state, the second high side input signal HIN2 and the second low side input signal LIN2 are substantially the same as the first high side input signal HIN1 and the first low side input signal LIN1, respectively.

The shoot-through preventer 140 according to the present exemplary embodiment may minimize a shoot-through phenomenon that may be generated during high voltage driving by restricting the simultaneously activated high side and low side input signals.

FIG. 9 illustrates a high voltage drive circuit 10 including a driver according to an exemplary embodiment of the present inventive concept. Referring to FIG. 9, the high voltage drive circuit 10 may include a driver 100 and an output terminal 200.

The driver 100 may include the structures of the drivers 100a and 100b of FIGS. 1 and 2. The driver 100 is not activated by receiving both of the high side input signal HIN and the low side input signal LIN. The driver 100 provides the high side output signal HOUT and the low side output signal LOUT into which a preset dead time is inserted.

The high side input signal HIN may include the first high side input signal HIN1 and the second high side input signal HIN2. The low side input signal LIN may include the first low side input signal LIN1 and the second low side input signal LIN2.

The driver 100 generates an edge detection signal by detecting rising edges of the high side input signal HIN and the low side input signal LIN, and generates a dead time signal indicating a present dead time in response to the edge detection signal. The driver 100 provides the high side output signal HOUT and the low side output signal LOUT by inserting the preset dead time into the high side input signal HIN and the low side input signal LIN based on the dead time signal.

The output terminal 200 may include a first output transistor OT1 and a second output transistor OT2. The first output transistor OT1 includes a first terminal to which a high power voltage HVCC is applied, a gate to which the high side output signal HOUT is applied, and a second terminal for providing a system output signal OUT. The second output transistor OT2 provides the system output signal OUT and includes a first terminal connected to the second terminal of the first output transistor OT1, a gate to which the low side output signal LOUT is applied, and a second terminal connected to a ground voltage GND.

The first output transistor OT1 is turned on in response to the high side output signal HOUT and provides the high power voltage HVCC as the system output signal OUT. When the high side output signal HOUT is activated, the low side output signal LOUT is deactivated so that the system output signal OUT may be stably provided.

When the low side output signal LOUT is activated and the high side output signal HOUT is deactivated, the first output transistor OT1 is turned off and the second output transistor OT2 is turned on so that the ground voltage GND may be provided as the system output voltage OUT.

When the high side output signal HOUT and the low side output signal LOUT are simultaneously activated, the high power voltage HVCC flows through the first output transistor OT1 is turned off and the second output transistor OT2 so that each transistor may be damaged and also reliability of the system output signal OUT may not be guaranteed. Thus, as illustrated in FIG. 2, by including the shoot-through preventer 140, the activation of both of the high side input signal HIN and the low side input signal LIN may be restricted.

However, even when the activation of both of the high side input signal HIN and the low side input signal LIN may be restricted, both of the high side input signal HIN and the low side input signal LIN may be activated due to delay or noise of constituent elements of both signals at a shift time point. When a dead time is inserted at a shift time point of each signal to prevent such a phenomenon, or when an error is generated in the dead time inserted into the high side output signal HOUT and the low side output signal LOUT, the system output signal OUT may not maintain a constant level and be fluctuated. Thus, the driver according to the present inventive concept and the high voltage drive circuit including the driver may provide a dead time inserted into the high side output signal HOUT and the low side output signal LOUT through the same path so that an error of a dead time may be minimized and the system output signal OUT may be stably provided.

As described above, the high voltage drive circuit including a driver according to the above-described exemplary embodiments of the present incentive concept may minimize mismatching of the dead time of high side and low side drive terminals by detecting an edge of a drive input signal and inserting dead time generated in a single path.

Also, the high voltage drive circuit including a driver according to the above-described exemplary embodiments of the present incentive concept may stably provide a drive signal by generating a dead time signal based on a phase detection signal having a relatively smaller size and minimizing an error of the dead time.

While the inventive concept has been particularly shown and described with reference to exemplary embodiments thereof, it will be understood that various changes in form and details may be made therein without departing from the spirit and scope of the following claims.

What is claimed is:

1. A high voltage drive circuit comprising:
    an edge detector for generating an edge detection signal by detecting edges of a first high side input signal and a first low side input signal, the edge detector providing a high side delay signal and a low side delay signal by delaying the first high side input signal and the first low side input signal;
    a dead time generator for generating a single dead time signal indicating a preset dead time in response to the edge detection signal; and
    a driver comprising a drive signal generator for providing a high side output signal and a low side output signal by inserting the preset dead time based on the single dead time signal into both of the high side delay signal and the low side delay signal.

2. The high voltage drive circuit of claim 1, wherein the dead time generator comprises:
    a delay capacitor charged in response to the edge detection signal; and
    a comparator for providing the dead time signal by comparing a delay voltage corresponding to an amount of electric charges charged in the delay capacitor with a reference voltage.

3. The high voltage drive circuit of claim 2, wherein the dead time generator further comprises an external resistor electrically connected to the delay capacitor via a pad and controlling the preset dead time.

4. The high voltage drive circuit of claim 1, wherein the drive signal generator comprises:
    a first logic operator for providing the high side output signal by performing an AND operation on the high side delay input signal and the dead time signal; and
    a second logic operator for providing the low side output signal by performing an AND operation on the low side delay input signal and the dead time signal.

5. The high voltage drive circuit of claim 1, further comprising a shoot-through preventer for receiving a second high side input signal and a second low side input signal and, when the second high side input signal and the second low side input signal are simultaneously activated, deactivating the second high side input signal and the second low side input signal and providing the deactivated second high side and low side input signals as the first high side input signal and the first low side input signal, respectively.

6. The high voltage drive circuit of claim 5, wherein the shoot-through preventer comprises:
    an RS latch circuit for providing a high side latch signal and a low side latch signal by receiving the second high side input signal as a set signal and the second low side input signal as a reset signal;
    a first prevention logic operator for providing the first high side input signal by performing an AND operation on the high side latch signal and the second high side input signal; and
    a second prevention logic operator for providing the first low side input signal by performing an AND operation on a low side latch signal, and the second low side input signal.

7. The high voltage drive circuit of claim 6, wherein the low side latch signal corresponds to a complementary signal of the high side latch signal.

8. The high voltage drive circuit of claim 1, wherein the edge detector generates the edge detection signal activated for a preset edge detection time by detecting at least one of rising edges of the first high side input signal and the first low side input signal.

9. The high voltage drive circuit of claim 1, wherein the edge detector comprises:
    an input delay unit for generating the high side delay signal based on the first high side input signal and a high side intermediate input signal obtained by delaying the first high side input signal, and generating the low side delay signal based on the first low side input signal and a low side intermediate input signal obtained by delaying the first low side input signal; and an edge detection logic operator for generating the edge detection signal based on the high side delay signal and the low side delay signal.

10. The high voltage drive circuit of claim 9, wherein the input delay unit comprises:

at least one high side delay buffer for providing the high side intermediate input signal by delaying the first high side input signal;

at least one low side delay buffer for providing the low side intermediate input signal by delaying the first low side input signal; and an input delay logic operation unit for providing the high side delay signal by performing an AND operation on the high side intermediate input signal and the first high side input signal, and providing the low side delay signal by performing an AND operation on the low side intermediate input signal and the first low side input signal.

11. A high voltage drive circuit comprising:

a driver for generating an edge detection signal by detecting rising edges of a first high side input signal and a first low side input signal, charging a delay capacitor in response to the edge detection signal, generating a dead time signal indicating a preset dead time by comparing a reference voltage with a delay voltage corresponding to an amount of charge in the delay capacitor, and providing a high side output signal and a low side output signal by inserting the preset dead time based on the dead time signal into the first high side and low side input signals; and an output terminal driven by a high power voltage and providing a system output signal in response to the high side output signal and a low side output signal.

12. The high voltage drive circuit of claim 11, wherein the output terminal comprises:

a high side output transistor connected between the high power voltage and an output end through which the system output signal is provided, and turned on in response to the high side output signal; and a low side output transistor connected between the output end and a ground terminal and turned on in response to the low side output signal.

13. The high voltage drive circuit of claim 11, wherein the edge detection signal is activated for a preset edge detection time and the preset edge detection time is shorter than the preset dead time.

14. The high voltage drive circuit of claim 11, wherein the driver comprises:

an edge detector for generating the edge detection signal by detecting edges of the first high side input signal and the first low side input signal, the edge detector providing a high side delay signal and a low side delay signal by delaying the first high side input signal and the first low side input signal;

a dead time generator for generating the dead time signal in response to the edge detection signal; and a drive signal generator for providing the high side output signal and the low side output signal by inserting the preset dead time based on the dead time signal into the high side delay signal and the low side delay signal.

15. The high voltage drive circuit of claim 14, further comprising a shoot-through preventer for receiving a second high side input signal and a second low side input signal from the outside and, when the second high side input signal and the second low side input signal are simultaneously activated, deactivating the second high side input signal and the second low side input signal and providing the deactivated second high side and low side input signals as the first high side input signal and the first low side input signal, respectively.

16. The high voltage drive circuit of claim 11, wherein the high power voltage is about 600 V.

* * * * *